United States Patent [19]

Horie

[11] Patent Number: 4,988,955
[45] Date of Patent: Jan. 29, 1991

[54] PHASE-LOCKED LOOP APPARATUS

[75] Inventor: Hiroshi Horie, Hino, Japan

[73] Assignee: Kabushiki Kaisha Toshiba, Kawasaki, Japan

[21] Appl. No.: 480,927

[22] Filed: Feb. 16, 1990

[30] Foreign Application Priority Data

Feb. 17, 1989 [JP] Japan .................................. 1-37968

[51] Int. Cl.$^5$ .............................................. H03L 7/08
[52] U.S. Cl. .................................. 331/11; 331/DIG. 2
[58] Field of Search ..................... 331/1 A, 10, 11, 17, 331/25, DIG. 2

[56] References Cited

U.S. PATENT DOCUMENTS 4,297,650 10/1981 Shinmyo ................................. 331/11

Primary Examiner—Robert J. Pascal
Attorney, Agent, or Firm—Cushman, Darby & Cushman

[57] ABSTRACT

A clock signal having a predetermined frequency output from a clock generator and a signal output from a voltage controlled oscillator (VCO) and supplied through a frequency divider are supplied to a phase detector. An output from the phase detector is supplied to a loop filter. The loop filter supplies a voltage in accordance with an output from the phase detector to a first control voltage terminal of the VCO and to a phase lock-in circuit. The phase lock-in circuit supplies a voltage in accordance with an output voltage from the loop filter to a second control voltage terminal of the VCO. In the VCO, the sensitivity of the first control voltage terminal is lower than that of the second control voltage terminal, i.e., a rate of change in ouput frequency with respect to a change in second control voltage is higher than that of the first control voltage. A phase lock detector for detecting whether or not the PLL apparatus is set in a phase-locked state is also connected to the phase lock-in circuit. When the phase lock detector detects a phase-locked state, a trigger signal is supplied to a power Vi turn off circuit to turn off a power source Vi. The power source Vi is connected to the clock generator, the phase detector, a part of the phase lock-in circuit, the phase lock detector, and the frequency divider. Power is always supplied from a power source Vc to the remaining circuit of the phase lock-in circuit.

27 Claims, 6 Drawing Sheets

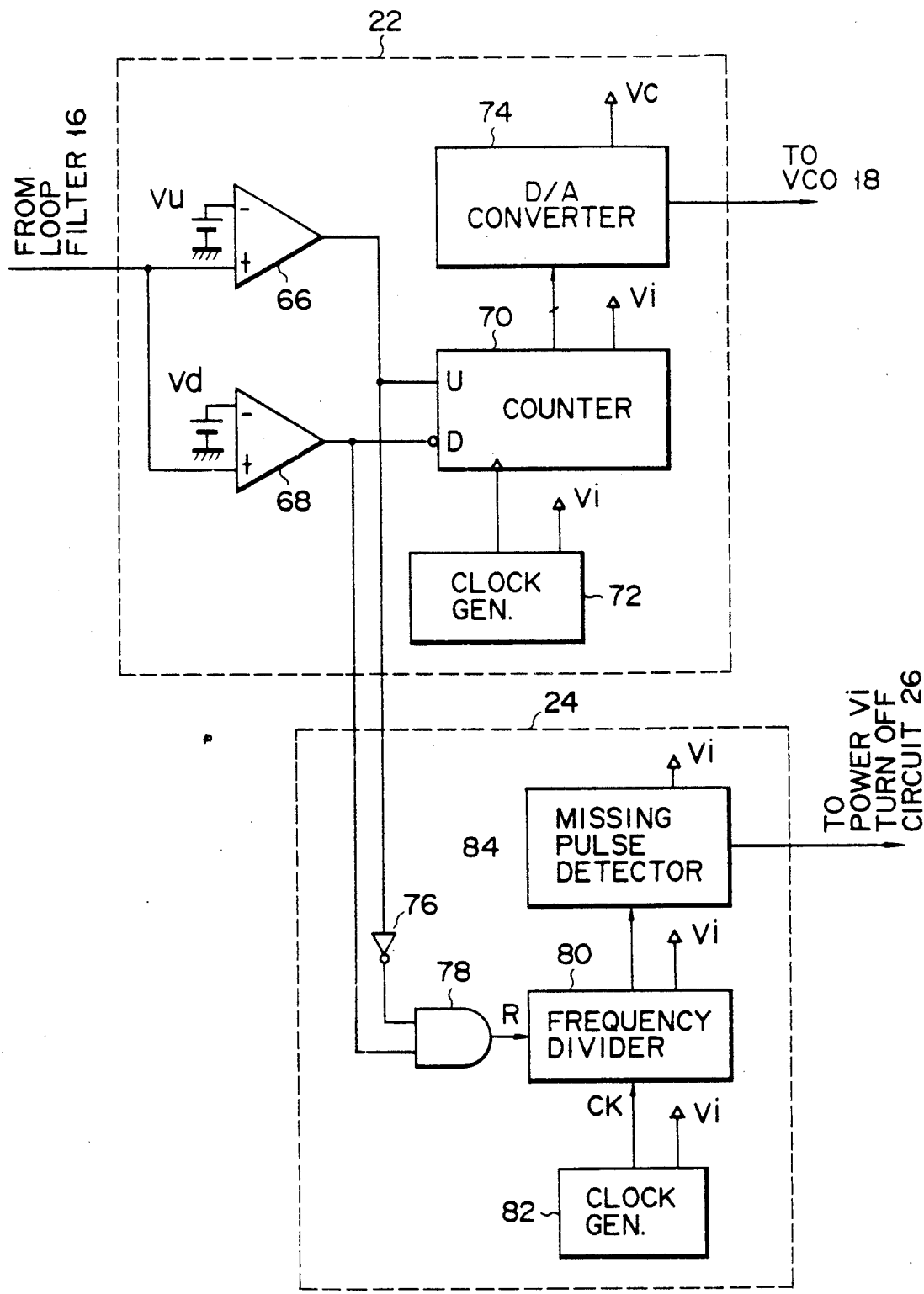
F I G. 5

PHASE-LOCKED LOOP APPARATUS

BACKGROUND OF THE INVENTION

1. Field of the Invention

The present invention relates to a PLL (phase-locked loop) apparatus.

2. Description of the Related Art

A conventional PLL apparatus includes a voltage controlled oscillator (VCO) for providing an output signal, and a phase-locked loop formed of a frequency divider for frequency-dividing the output signal from the VCO with a predetermined ratio to convert the VCO output into a predetermined frequency signal, a clock generator for generating a reference clock signal having the predetermined frequency, a phase detector for detecting a phase difference between an output signal from the frequency divider and the reference clock signal, and a loop filter for applying a control voltage to the VCO in accordance with the phase difference. More specifically, the PLL loop controls the control voltage for the VCO until the phases of the output signal from the frequency divider and the reference clock signal coincide with each other, i.e., a phase-locked state is set. The loop filter is formed of a resistor and a capacitor. The phase detector charges or discharges the capacitor depending on whether the phase difference is positive or negative, and supplies a potential difference across the capacitor to the VCO as the control voltage.

When a phase-locked state is set, an output from the phase detector, i.e., an input terminal of the loop filter is set in a high-impedance state. This state is the same as a state wherein nothing is connected to the input terminal of the loop filter. Therefore, even if a power source for supplying power to circuits except for the VCO is turned off in the locked state, the control voltage for the VCO is not changed. A frequency of the output signal from the VCO is not changed, and the phase-locked state can be kept. Such driving is so-called "intermittent PLL driving", and is often performed to save power of a power source for the PLL apparatus.

In practice, however, a leakage current flows through the capacitor. Therefore, when the intermittent PLL driving is performed and the power source for circuits except for the VCO is turned off, the terminal voltage of the capacitor in the loop filter is gradually decreased, and an oscillation frequency of the VCO is gradually changed.

Thus, in the conventional PLL apparatus, the terminal voltage of the capacitor in the loop filter directly changes the oscillation frequency of the VCO. Therefore, when the power source for circuits except for the VCO is turned off to save power in the phase-locked state, the terminal voltage of the capacitor is decreased due to the leakage current of the capacitor, and the output signal having a predetermined frequency cannot be stably obtained for a long period of time during the intermittent PLL driving.

SUMMARY OF THE INVENTION

It is an object of the present invention to provide a phase-locked loop apparatus which can stably obtain an output signal having a predetermined frequency for a long period of time even if a power source for a circuit except for a voltage controlled oscillator is turned off in a phase-locked state, i.e., an intermittent PLL operation is performed.

According to the present invention, there is provided a phase-locked loop apparatus comprising a voltage controlled oscillator including a first control voltage input terminal and a second control voltage input terminal having a sensitivity higher than that of the first control voltage input terminal, a phase detector for detecting a phase difference between a signal obtained by frequency-dividing an output signal from the voltage controlled oscillator with a predetermined ratio and a reference lock-in circuit for supplying a control voltage in accordance with an output from the phase detector to the first control voltage input terminal of the voltage controlled oscillator, and a second phase lock-in circuit for supplying a control voltage in accordance with the output from the phase detector to the second control voltage input terminal of the voltage controlled oscillator.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 5 is a block diagram showing a detailed arrangement of a phase lock-in circuit and a phase lock detector in the first embodiment;

DETAILED DESCRIPTION OF THE PREFERRED EMBODIMENTS

Embodiments of the phase-locked loop (PLL) apparatus according to the present invention will be described hereinafter with reference to the accompanying drawings.

Figure 1:
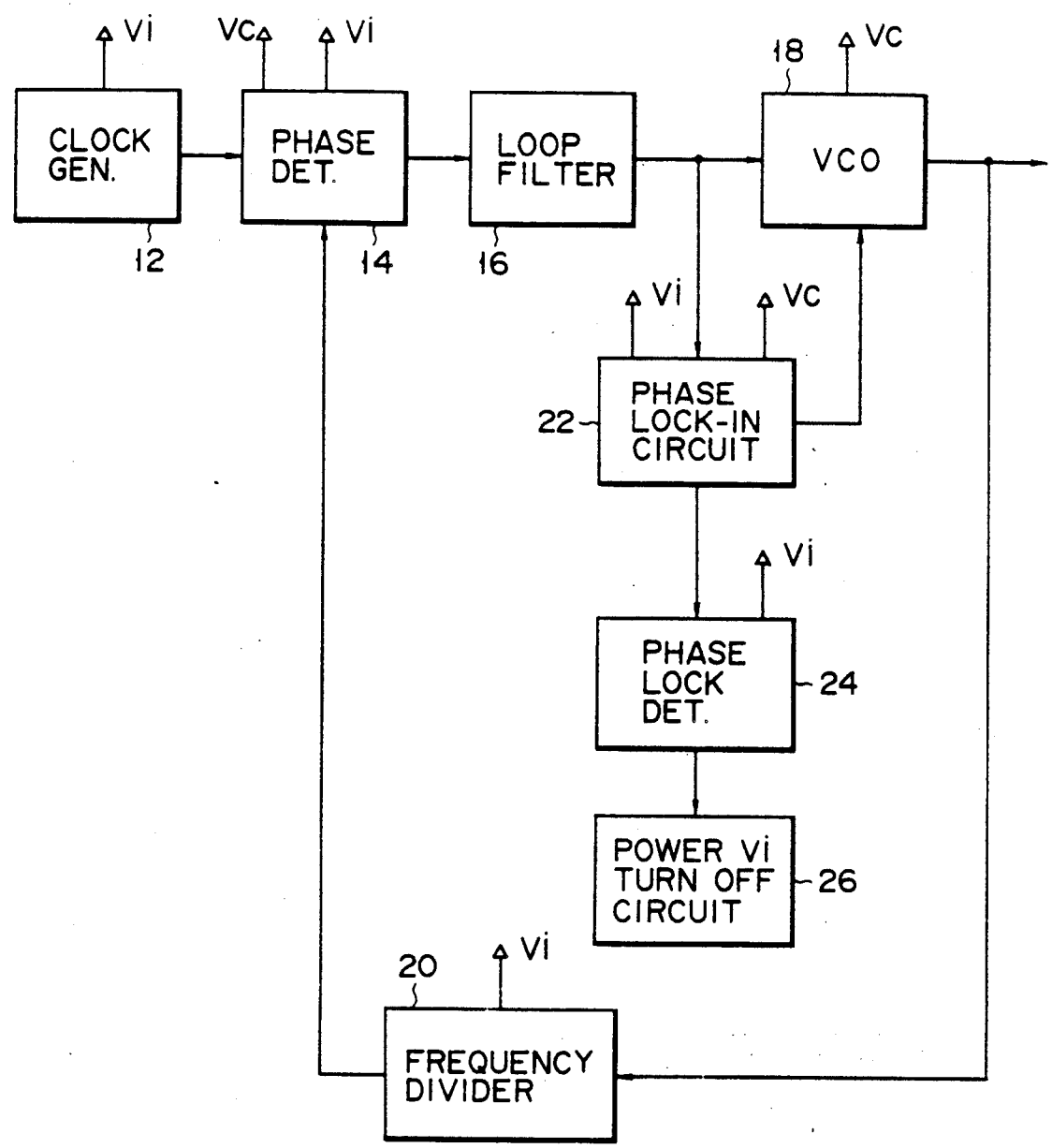
FIG. 1 is a block diagram of a phase-locked loop apparatus according to a first embodiment of the present invention.

FIG. 1 is a block diagram showing an arrangement of the first embodiment. A reference clock signal having a predetermined frequency output from a clock generator 12 is supplied to a first input terminal of a phase detector 14. An output signal from a voltage controlled oscillator (VCO) 18, which is an output from the PLL apparatus, is supplied to a second input terminal of the phase detector 14 through a frequency divider 20. A frequency of the clock generator 12 and a frequency dividing ratio of the frequency divider 20 are set to be values to allow outputting of an oscillation signal having a desired frequency from the VCO 18 when the PLL apparatus is set in a phase-locked state. The phase detector 14 detects a phase difference between the reference clock signal and the output from the frequency divider 20, and supplies a detection result to a loop filter 16.

The loop filter 16 generates a first control voltage which changes in accordance with an output from the phase detector 14. The output voltage is supplied to a first control voltage terminal of the VCO 18, and is also supplied to a phase lock-in circuit 22. The phase lock-in circuit 22 generates a second control voltage in accordance with the output voltage from the loop filter 16. The output voltage of the phase lock-in circuit 22 is supplied to a second control voltage terminal of the VCO 18.

An oscillation frequency of the VCO 18 can be changed by both the first and second control voltages. The sensitivity, i.e., the rate of change in output frequency with respect to a change in control voltage, for the second control voltage is higher than that for the first control voltage. In other words, the output frequency is changed more quickly when the second control voltage is changed by a given value, as compared with a case wherein the first control voltage is changed by the given value.

A phase lock detector 24 is also connected to the phase lock-in circuit 22 to detect whether or not the PLL apparatus is set in a phase-locked state. When the phase lock detector 24 detects the phase-locked state, a detection signal is supplied to a power Vi turn off circuit 26. The turn off circuit 26 turns off a power source Vi in response to the detection signal. The power source Vi is connected to the clock generator 12, a part of the phase detector 14, a part of the phase lock-in circuit 22, the phase lock detector 24, and the frequency divider 20. The power source Vi is to be turned off after locking of the PLL apparatus to perform the intermittent PLL driving. Power is always supplied from a power source Vc to the VCO 18 and the remaining parts of the phase detector 14 and the phase lock-in circuit 22.

Figure 2:
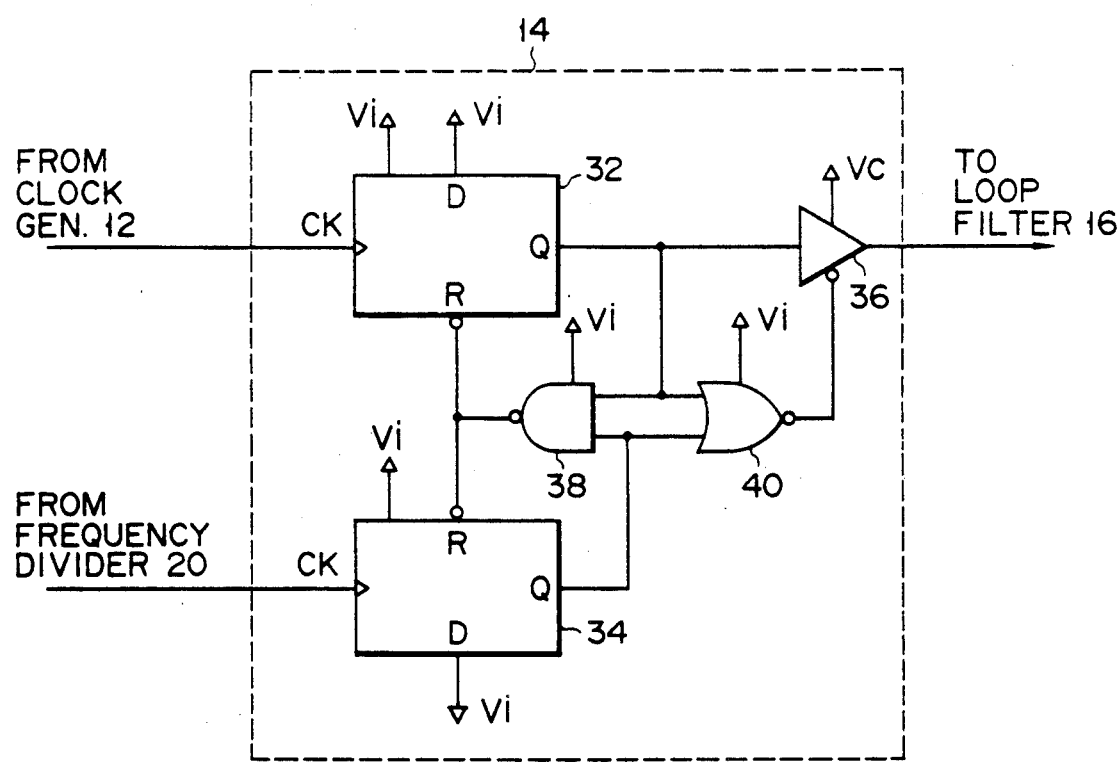
FIG. 2 is a block diagram showing a detailed arrangement of a phase detector in the first embodiment.

Each section in the first embodiment will be described hereinafter. A detailed arrangement of the phase detector 14 is shown in FIG. 2. The reference clock signal from the clock generator 12 is input to the clock terminal of a D-type flip-flop 32. An output signal from the frequency divider 20 is input to the clock terminal of a D-type flip-flop 34. The input terminals Ds of the flip-flops 32 and 34 are connected to the power source Vi. The flip-flops 32 and 34 are, therefore, set upon every setting of their clock terminals at "H" level, and output terminals Qs are set at "H" level. The Q output from the flip-flop 32 is output through a tri-state buffer 36. The Q outputs from the flip-flops 32 and 34 are input to a NAND gate 38 and a NOR gate 40. An output from the NAND gate 38 is input to reset terminals (low-active terminals) Rs of the flip-flops 32 and 34. The flip-flops 32 and 34 are, therefore, reset only when the Q outputs are both set at "H" level. An output from the NOR gate 40 is input to an enable terminal of the tri-state buffer 36. The tristate buffer 36 is set to an enable state when at least one of the Q outputs from the flip-flops 32 and 34 is set at "H" level, and the Q output from the flip-flop 32 is supplied to the loop filter 16 intact. In a case except for the above case, i.e., when the Q outputs of flip-flops 32 and 34 are both set at "L" level, the output terminal of the tri-state buffer 36 is set in a high-impedance state. The tri-state buffer 36 is connected to the power source Vc and the NAND gate 38 and the NOR gate 40 are connected to the power source Vi.

Figure 3:
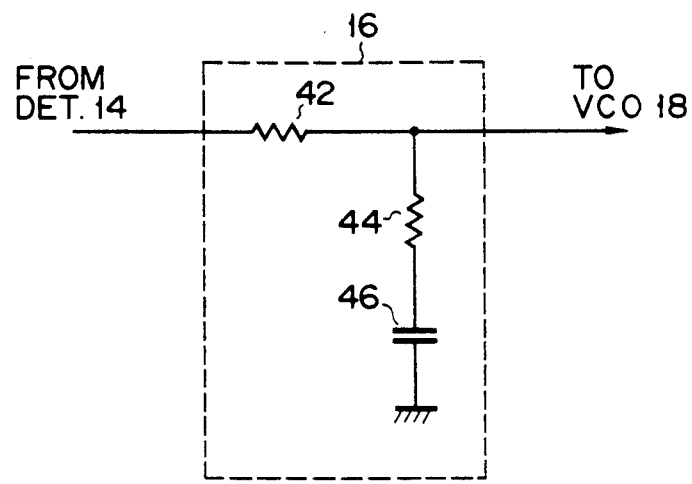
FIG. 3 is a block diagram showing a detailed arrangement of a loop filter in the first embodiment.

A detailed arrangement of the loop filter 16 is shown in FIG. 3. The loop filter 16 includes a resistor 42 connected between the output terminal of the phase detector 14 and the first control voltage terminal of the VCO 18, and a series circuit of a resistor 44 and a capacitor 46 connected between the first control voltage terminal and the ground terminal. The first control voltage for the VCO 18 is a terminal voltage of the capacitor 46.

In the phase detector 14 arranged in this manner, the tri-state buffer 36 is turned on in response to one of the Q outputs of "H" level from the flip-flop 32 or 34 and is turned off in response to the other of the Q outputs of "H" level from the flip-flop 32 or 34. That period depending on the phase difference between the reference clock signal and the output signal from the frequency divider 20. The capacitor 46 in the loop filter 16 is charged or discharged through the tri-state buffer 36, depending on which of the two input signals to the phase detector 14 leads with respect to the other. Thus, the first control voltage for the VCO 18 can be changed in accordance with the phase difference between the reference clock signal and the output from the frequency divider 20. When the oscillation frequency of the VCO 18 approaches a desired frequency, and the phase difference becomes almost 0 (rad), both the flip-flops 32 and 34 are reset. Therefore, an output from the tri-state buffer 36 is set in a high-impedance state, and the terminal voltage of the capacitor 46 in the loop filter 16 is kept to be the value at the time.

Figure 4:
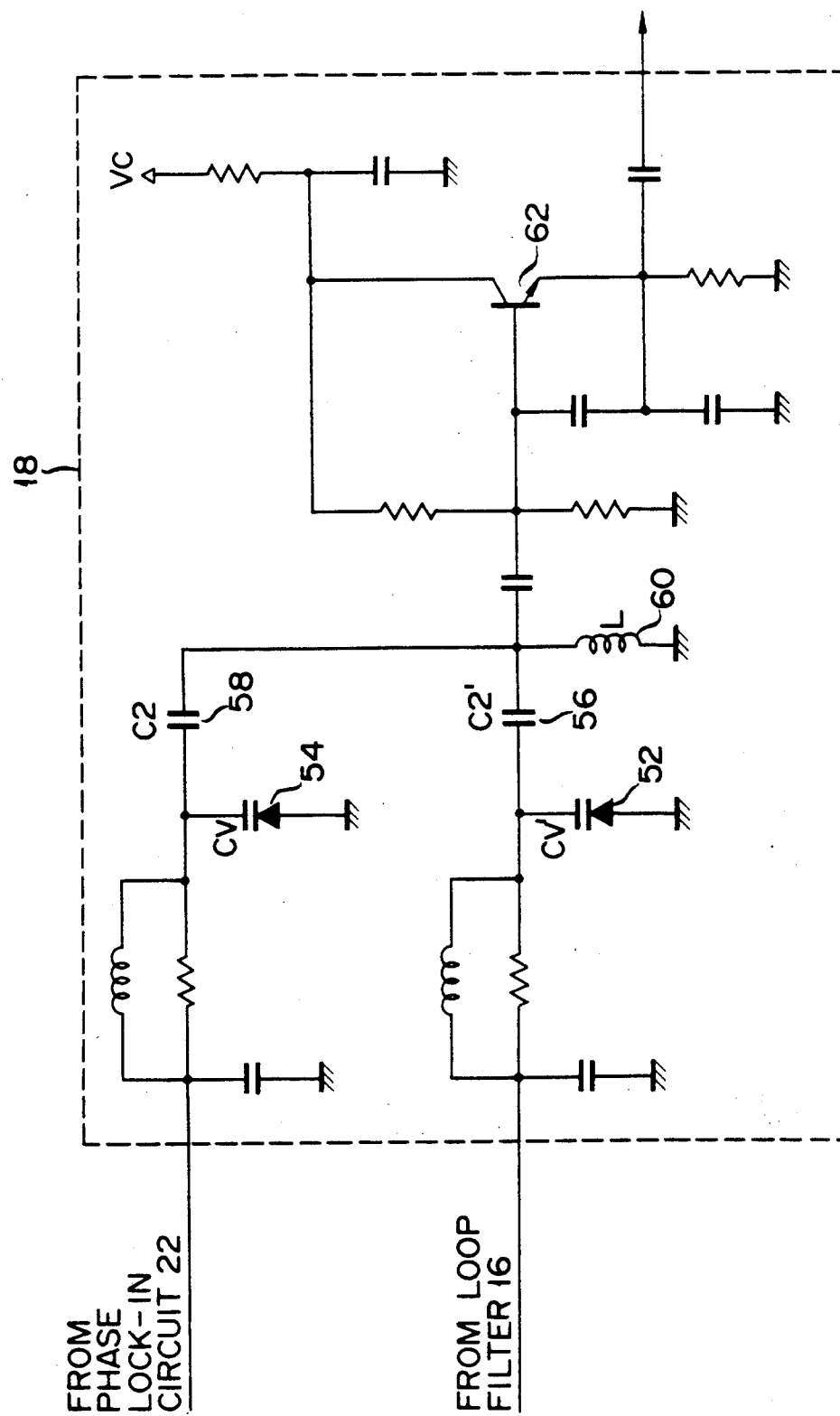
FIG. 4 is a block diagram showing a detailed arrangement of a voltage controlled oscillator in the first embodiment.

A detailed arrangement of the VCO 18 is shown in FIG. 4. The VCO 18 includes two LC circuits; one is formed of a varactor diode 54, a capacitor 58 and an inductor 60; the other is formed of a varactor diode 52, a capacitor 56 and the inductor 60. The first control voltage from the loop filter 16 is applied to the varactor diode 52 and the second control voltage from the phase lock-in circuit 22 is applied to the varactor diode 54. The two LC circuits are connected to a base of an oscillation transistor 62. A collector of the transistor 62 is connected to the power source Vc. The VCO output is output from an emitter of the transistor 62.

In the VCO 18, when the control voltage is applied to the LC circuit, the capacitance of the varactor diode is changed in accordance with the control voltage, and the oscillation frequency of the transistor 62 is changed. It is noted that the capacitance C2 of the capacitor 58 is 100 (pF) and C2' of the capacitor 56 is 5 (pF). When the capacitance Cv of the varactor diode 54 and Cv' of the varactor diode 52 are both changed from 5 (pF) to 10 (pF) by applying the same control voltage to the first and the second control voltage input terminals, the capacitances of the two LC circuits are changed in the follow way. The total capacitance of the second LC circuit, including the varactor diode 54 and the capacitor 58, measured at the junction between the capacitor 56 and the inductor 60 is changed from $$7.26 \left( = \frac{1}{\frac{1}{5} + \frac{1}{100}} + \frac{1}{\frac{1}{5} + \frac{1}{5}} \right) (pF)$$

to $$11.59 \left( = \cfrac{1}{\cfrac{1}{10} + \cfrac{1}{100}} + \cfrac{1}{\cfrac{1}{5} + \cfrac{1}{5}} \right) (pF),$$

that is the capacitance is changed by 4.33 (pF).

The total capacitance of the first LC circuit, including the varactor diode S2 and the capacitor 56, measured at the junction between the capacitor 56 and the inductor 60 is changed from 7.26 (pF) to $$8.10 \left( = \cfrac{1}{\cfrac{1}{5} + \cfrac{1}{100}} + \cfrac{1}{\cfrac{1}{10} + \cfrac{1}{5}} \right) (pF),$$

that is the capacitance is changed by 0.84 (pF). Therefore, the degree of change in oscillation frequency for the second control voltage is higher than that for the first control voltage. In other words, the first control voltage terminal, to which the output terminal of the loop filter 16 is connected, has a lower sensitivity. For this reason, the power source Vi connected to the circuits except for the VCO 18 can be turned off to control an oscillation frequency of the VCO 18 by the terminal voltage of the capacitor 46 in the loop filter 16 after the PLL apparatus is set in a phase-locked state. Even if the terminal voltage of the capacitor 46 is decreased due to the leakage current therefrom during the intermittent PLL drive, a rate of change in oscillation frequency of the VCO 18 is lower than that of the prior art. The power source Vi connected to the circuits except for the VCO 18 can be kept OFF for a long period of time, thus saving power by the intermittent PLL driving.

Since the oscillation frequency of the VCO 18 is controlled by the first control voltage at low speed, it takes a long period of time to set the PLL apparatus to the phase-locked state. In this embodiment, therefore, the phase lock-in circuit 22 also controls the second control voltage to control an oscillation frequency of the VCO 18 at high speed, thus quickly setting the PLL apparatus in the phase-locked state. A detailed arrangement of the phase lock-in circuit 22 and the lock detector 24 is shown in FIG. 5.

The output voltage from the loop filter 16 supplied to the phase lock-in circuit 22 is compared with a reference voltage Vu slightly lower than the voltage of the power source Vi by a comparator 66, and is also compared with a reference voltage Vd slightly higher than the ground level by a comparator 68. The comparator 66 outputs a signal of "H" level when the output voltage from the loop filter 16 is higher than the reference voltage Vu. The comparator 68 outputs a signal of "H" level when the output voltage from the loop filter 16 is higher than the reference voltage Vd. An output from the comparator 66 is supplied to an up-count terminal of an up/down counter 70, and an out-put from the comparator 68 is supplied to a down-count terminal (low-active terminal) of the up/down counter 70. The counter 70 counts up or down, in accordance with the outputs of the comparators 66 and 68, a pulse having a predetermined frequency output from a clock generator 72. The clock generator 72 can be substituted by a frequency divider for frequency-dividing the reference clock signal from the clock generator 12.

The comparators 66 and 68 form a window comparator. When the output voltage from the loop filter 16 falls outside a range between the reference voltages Vu and Vd, the value counted by the counter 70 is changed. The output from the counter 70 is supplied to the second control voltage terminal of the VCO 18 through a D/A converter 74. If the reference voltages Vu and Vd are set in correspondence with a range of a desired frequency to be output from the VCO 18, the output from the clock generator 72 is counted by the counter 70 until the output signal from the loop filter 16 falls within the range between the reference voltages Vu and Vd. When the output voltage of the D/A converter 74 is changed, the oscillation frequency of the VCO 18 is changed at high speed. When the output frequency of the VCO 18 falls within the desired range, the counter 70 stops a counting operation. At this time, however, the output frequency of the VCO 18 does not coincide with a given desired frequency. Thereafter, the terminal voltage of the capacitor 46 in the loop filter 16 is changed in response to an output from the phase detector 14, and the output frequency of the VCO 18 is finely controlled to coincide with the desired frequency. The power source Vc is connected to the D/A converter 74, and the power source Vi is connected to the counter 70 and the clock generator 72.

Outputs from the comparators 66 and 68 are also supplied to the phase lock detector 24. An output from the comparator 66 is supplied to a first input terminal of an AND gate 78 through an inverter 76, and an output from the comparator 68 is supplied to a second input terminal of the AND gate 78. An output from the AND gate 78 is supplied to a reset terminal R of a frequency divider 80. The frequency divider 80 frequency-divides a pulse having a predetermined frequency output from a clock generator 82. The clock generator 82 can also be substituted by a frequency divider for frequency-dividing the output pulse from the clock generator 12. An output from the frequency divider 80 is supplied to a missing pulse detector 84.

In this phase lock detector 24, when the output voltage from the loop filter 16 falls within the range between the reference voltages Vu and Vd, the frequency divider 80 is reset. Therefore, when the output frequency of the VCO 18 falls within the desired range, the frequency divider 80 is kept reset, and a pulse signal is not supplied to the missing pulse detector 84. When this state continues for a predetermined time period or more, the missing pulse detector 84 detects missing of the pulse, and supplies a detection signal to the power Vi turn off circuit 26. Therefore, when a predetermined time period required for the oscillation frequency of the VCO 18 to coincide with the desired frequency by a fine control performed by the loop filter 16 elapses after the output frequency of the VCO 18 falls within the desired range corresponding to the reference voltages Vu and Vd, the phase lock detector 24 detects a phase-locked state, and the power source Vi connected to the circuits except for the VCO 18, the D/A converter 74 in the phase lock-in circuit 22, and the tri-state buffer 36 in the phase detector 14 is turned off, thus performing the intermittent PLL driving.

Thereafter, the value counted by the counter 70 is not changed, and the output voltage of the D/A converter 74 and the second control voltage of the VCO 18 are kept constant. It is noted that the D/A converter 74 includes a register for storing an input data. As described above, since the output terminal of the loop filter 16 is connected to the first control voltage terminal with a low-sensitivity of the VCO 18, the output frequency of the VCO 18 is relatively free from the influence of a leakage current of the capacitor 46 of the loop filter 16 during the intermittent PLL driving, and an output signal having a predetermined frequency can be stably supplied for a long period of time.

As has been described above, according to the first embodiment, the VCO having a low-sensitivity (low-speed) first control voltage terminal and a high-sensitivity (high-speed) second control voltage terminal is used, the output terminal of the loop filter is connected to the low-sensitivity first control voltage terminal, and the phase lock-in circuit for generating a control voltage which can set an output from the loop filter within a voltage range corresponding to a predetermined frequency range is connected to the high-sensitivity second control voltage terminal. Therefore, after the phase is locked, even if the power source for the circuits except for the VCO and the power source for the circuits which hold an output from the phase lock-in circuit are turned off, an output frequency of the VCO is relatively free from the influence of the leakage current of the capacitor in the loop filter. As a result, a stable oscillation frequency can be obtained for a long period of time even if the intermittent PLL driving is performed.

It is noted that when a D/A converter 74 having high precision, i.e., having a large number of input bits, is used, the sensitivity of the first control voltage terminal of the VCO 18 to which the output terminal of the loop filter 16 is connected can be reduced. In addition, a change in oscillation frequency due to the leakage current can be suppressed.

Figure 6:
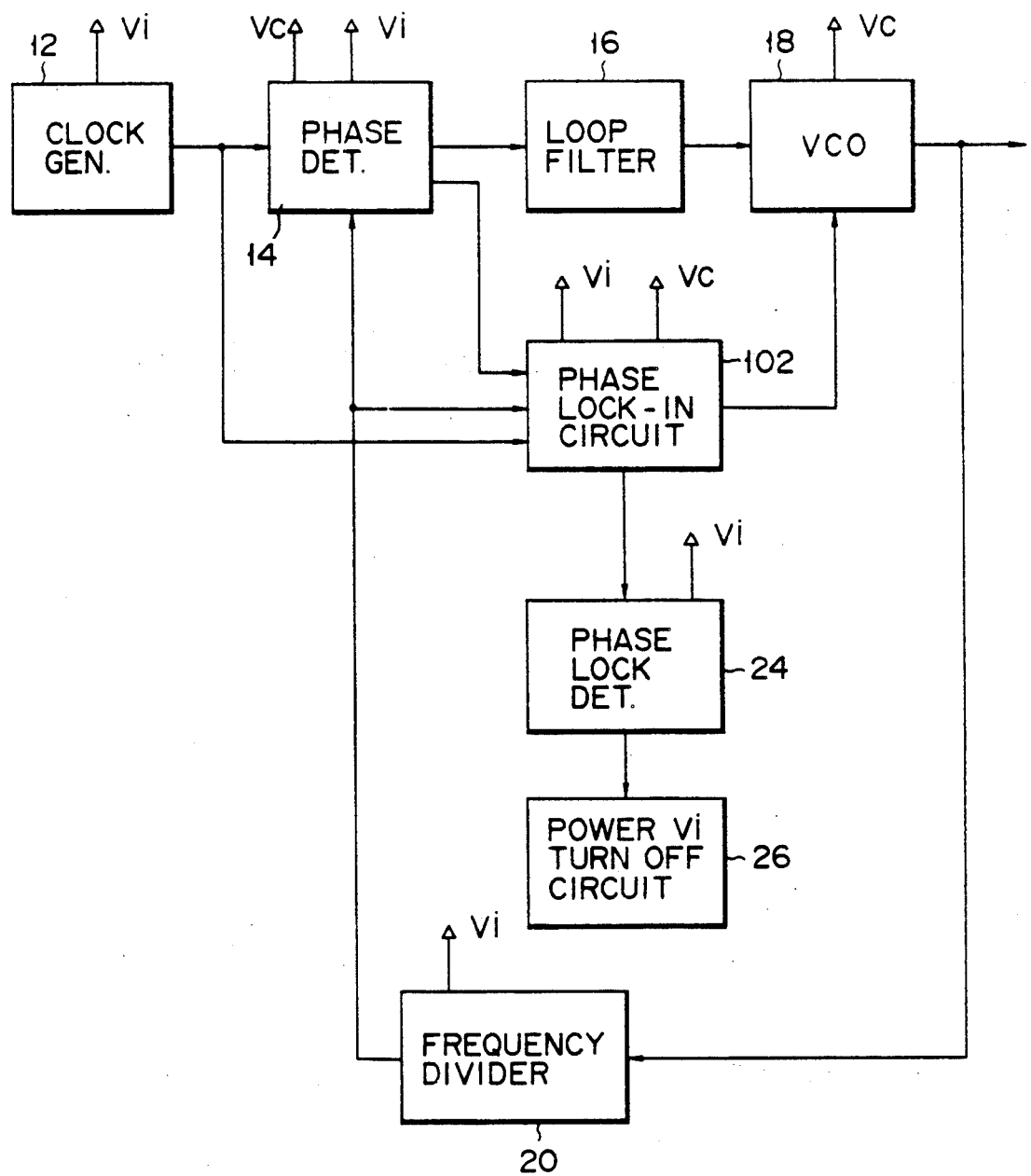
FIG. 6 is a block diagram of a phase-locked loop apparatus according to a second embodiment of the present invention.

FIG. 6 is a block diagram of the PLL apparatus according to a second embodiment. A phase lock-in circuit in the second embodiment is different from that in the first embodiment. In this embodiment, a phase lock-in circuit 102 does not receive an output signal from the loop filter 16, but receives two input signals and an output signal of the phase detector 14 to generate a second control voltage for the VCO 18.

Figure 7:
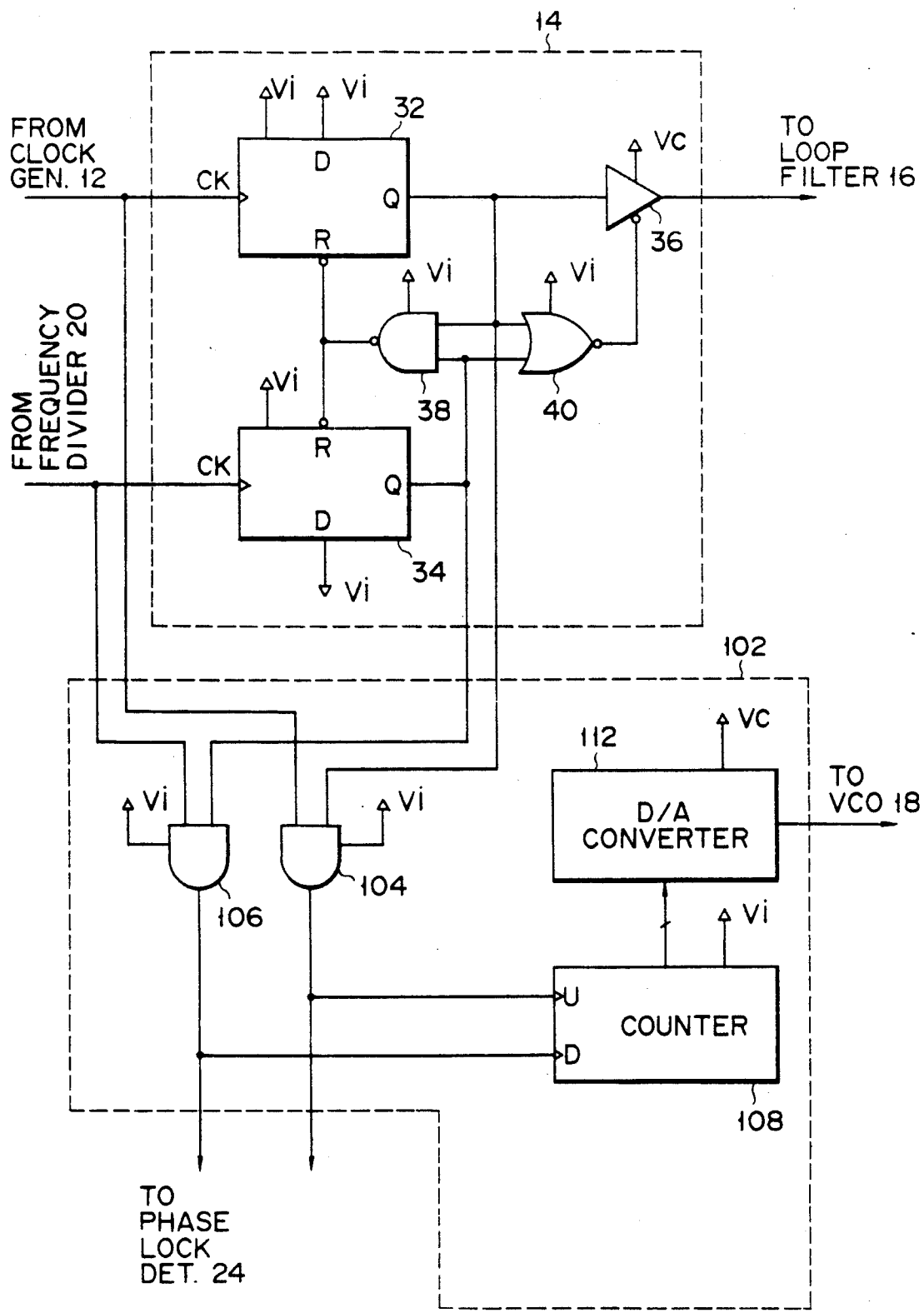
FIG. 7 is a block diagram showing a detailed arrangement of a phase detector and a phase lock-in circuit in the second embodiment.

A detailed arrangement of the phase lock-in circuit 102 and the phase detector 14 is shown in FIG. 7. The phase detector 14 includes the same circuits as in the first embodiment shown in FIG. 2. The Q outputs from the flip-flops 32 and 34 are supplied to the phase lock-in circuit 102. The Q outputs from the flip-flops 32 and 34 are supplied to first input terminals of AND gates 104 and 106, respectively. The outputs from the clock generator 12 and the frequency divider 20 which is connected to the VCO 18 are supplied to second input terminals of the AND gates 104 and 106. Outputs from the AND gates 104 and 106 are supplied to up-count and down-count terminals of a counter 108, respectively. The counter 108 counts up or down a pulse signal from the clock generator 12 or the frequency divider 20.

As described above, when a phase difference between outputs from the clock generator 12 and the frequency divider 20 is $2\pi$ (rad) or more, one of the flip-flops 32 and 34 is kept reset. When the phase of the output from the clock generator 12 leads the other by more than $2\pi$ (rad), the output from the clock generator 12 passes through the AND gate 104, but the output from the AND gate 106 is always set at "L" level. On the contrary, when the phase of the output from the frequency divider 20 leads the other by more than $2\pi$ (rad), the output from the frequency divider 20 passes through the AND gate 106, but the output from the AND gate 104 is always set at "L" level. The counter 108 performs a count up or down operation in accordance with whether the AND gate 104 or 106 is set at "H" level to variably control the second control voltage of the VCO 18, and to control the frequency of the VCO 18. When a phase difference between the output from the clock generator 12 and the output from the frequency divider 20 becomes less than $2\pi$ (rad), both the outputs of the AND gates 104 and difference is below $2\pi$ (rad), an output from the D/A converter 112 is kept at the previous value, and the oscillation frequency of the VCO 18 is always controlled by the terminal voltage of the capacitor 46 in the loop filter 16. An operation after the phase is locked is the same as in the first embodiment.

Thus, according to the second embodiment, the value counted by the counter 108 is changed in accordance with the phase difference between the output from the VCO 18 and the reference clock. Therefore, the second control voltage of the VCO 18 is controlled, and the output frequency of the VCO 18 falls within a predetermined range. Thereafter, when the output frequency of the VCO 18 is controlled in order to coincide with a desired frequency by the capacitor 46 in the loop filter 16 in the same manner as in the first embodiment, the power source Vi is turned off, and the intermittent PLL driving is performed. Thereafter, even if the terminal voltage of the capacitor 46 is changed due to the leakage current, a change in output frequency of the VCO 18 can be minimized. In addition, since a comparator is not used in the phase lock-in circuit 102 in the second embodiment, it is easy to form the apparatus by an IC.

As has been described above, according to the present invention, a voltage controlled oscillator having a first control voltage input terminal and a second control voltage input terminal having a sensitivity higher than that of the first control voltage input terminal is used. The apparatus of the present invention also includes a phase detector for detecting a phase difference between a signal obtained by frequency-dividing an output signal from the voltage controlled oscillator with a predetermined ratio and a reference signal, a loop filter for supplying a control voltage in accordance with an output from the phase detector to the first control voltage terminal of the voltage controlled oscillator, and a phase lock-in circuit for supplying a control voltage in accordance with an output from the phase detector to the second control voltage terminal of the voltage controlled oscillator. Therefore, there is provided a phase-locked loop apparatus which can stably obtain an output signal having a predetermined frequency for a long period of time, even if a power source for the circuits except for the voltage controlled oscillator is turned off in a phase-locked state, i.e., an intermittent PLL operation is performed.

Additional advantages and modifications will readily occur to those skilled in the art. Therefore, the invention in its broader aspects is not limited to the specific details, representative apparatuses, and illustrated embodiments shown and described herein. Accordingly, various modifications may be made without departing from the spirit or scope of the general inventive concept as defined by the appended claims and their equivalents.

What is claimed is:
1. A phase-locked loop apparatus comprising:
  voltage controlled oscillating means including a first control voltage terminal and a second control voltage terminal having a sensitivity higher than that of said first control voltage terminal;

means for detecting a phase difference between a signal obtained by frequency-dividing an output signal from said voltage controlled oscillating means by a predetermined ratio and a reference signal;

first phase lock-in means for supplying a control voltage in accordance with an output from said phase difference detecting means to said first control voltage terminal of said voltage controlled oscillating means; and second phase lock-in means for supplying a control voltage in accordance with an output from said first phase lock-in means to said second control voltage terminal of said voltage controlled oscillating means, said second phase lock-in means comprising:

counter means for counting up or down a clock pulse in accordance with an output from said first phase lock-in means; and digital/analog converting means for applying a voltage in accordance with an output value from said counter means to said control terminal of said voltage controlled oscillating means.

2. An apparatus according to claim 1 in which said counter means comprises:

a window comparator for detecting whether an output voltage value of said first phase lock-in means falls within a predetermined range; and a counter for counting up or down the clock pulse in accordance with an output from said window comparator.

3. An apparatus according to claim 1, in which said phase difference detecting means comprises:

frequency divider means for frequency-dividing the output signal from said voltage controlled oscillating means; and clock generating means for generating the reference signal, and which further comprises:

means for detecting whether said voltage controlled oscillating means is set in a locked state; and means for turning off a power source for at least said frequency divider means and said clock generating means when the locked state is detected by said locked-state detecting means.

4. An apparatus according to claim 3, in which said locked-state detecting means comprises means for detecting a locked state when an output from said window comparator is not changed for not less than a predetermined period of time.

5. A phase-locked loop apparatus comprising:

voltage controlled oscillating means including a first control voltage terminal and a second control voltage terminal having a sensitivity higher than that of said first control voltage terminal;

means for detecting a phase difference between a signal obtained by frequency-dividing an output signal from said voltage controlled oscillating means by a predetermined ratio and a reference signal;

first phase lock-in means for supplying a control voltage in accordance with an output from said phase difference detecting means to said first control voltage terminal of said voltage controlled oscillating means; and second phase lock-in means for supplying a control voltage in accordance with an output from said first phase lock-in means to said second control voltage terminal of said voltage controlled oscillating means, said phase difference detecting means comprising:

frequency divider means for frequency-dividing the output signal from said voltage controlled oscillating means; and clock generating means for generating the reference signal, and which further comprises:

means for detecting whether said voltage controlled oscillating means is in a locked state; and means for turning off a power source for at least said frequency divider means and said clock generating means when the locked state is detected by said locked-state detecting means.

6. An apparatus according to claim 5, in which said locked-state detecting means comprises means for detecting a locked state when an output from said first phase lock-in means is not changed for not less than a predetermined period of time and within not less than a predetermined range.

7. A phase-locked loop apparatus comprising:

voltage controlled oscillating means including a first control voltage terminal and a second control voltage terminal having a sensitivity higher than that of said first control voltage terminal;

means for detecting a phase difference between a signal obtained by frequency-dividing an output signal from said voltage controlled oscillating means with a predetermined ratio and a reference signal;

first phase lock-in means for supplying a control voltage in accordance with an output from said phase difference detecting means to said first control voltage terminal of said voltage controlled oscillating means; and second phase lock-in means for supplying a control voltage in accordance with the output from said phase difference detecting means to said second control voltage terminal of said voltage controlled oscillating means.

8. An apparatus according to claim 7, in which said voltage controlled oscillating means comprises:

means for outputting a first output signal having a frequency which changes within a first frequency range when a control voltage supplied to said first control voltage terminal changes within a predetermined range; and means for outputting a second output signal having a frequency which changes within a second frequency range wider than the first frequency range when the control voltage supplied to said second control voltage terminal changes within the predetermined range.

9. An apparatus according to claim 10, in which said first phase lock-in means comprises a loop filter including a first resistor connected between an output terminal of said phase difference detecting means and said first control voltage terminal of said voltage controlled oscillating means, a second resistor, and a capacitor, said second resistor and said capacitor being connected in series between said first control voltage terminal and a reference voltage terminal.

10. An apparatus according to claim 7, in which said second phase lock-in means comprises:

counter means for counting up or down a clock pulse in response to an output from said phase detecting means; and digital/analog converting means for applying a voltage in accordance with an output value of said counter means to said second control voltage terminal of said voltage controlled oscillating means.

11. An apparatus according to claim 13, in which said phase difference detecting means comprises:
frequency divider means for frequency-dividing the output signal from said voltage controlled oscillating means; and
clock generating means for generating the reference signal, and which further comprises:
means for detecting whether said voltage controlled oscillating means is set in a locked state; and
means for turning off a power source for at least said frequency divider means and said clock generating means when the locked state is detected by said locked-state.

12. An apparatus according to claim 11, in which said locked-state detecting means comprises means for detecting a locked stated when at output from said phase difference detecting means is not changed for not less than a predetermined period of time.

13. An apparatus according to claim 7, in which said phase difference detecting means comprises:
frequency divider means for frequency-dividing the output signal from aid voltage controlled oscillating means; and
clock generating means for generating the reference signal, and which further comprises:
means for detecting whether said voltage controlled oscillating means is set in a locked state; and
means for turning off a power source for at least said frequency divider means and said clock generating means when the locked state is detected by said locked-state detecting means.

14. An apparatus according to claim 13, in which said locked-state detecting means comprises means for detecting a locked state when an output from said first phase detecting means is not changed for not less than a predetermined period of time and within not less than a predetermined range.

15. A phase-locked loop apparatus comprising:
voltage controlled oscillating means including a first control voltage terminal and a second control voltage terminal having a sensitivity higher than that of said first control voltage terminal;
means for detecting a phase difference between a signal obtained by frequency-dividing an output signal from said voltage controlled oscillating means with a predetermined ratio and a reference signal;
first phase lock-in means for supplying a control voltage in accordance with an output from said phase difference detecting means to said first control voltage terminal of said voltage controlled oscillating means;
second phase lock-in means for supplying, to said second control voltage terminal of said voltage controlled oscillating means, a control voltage in accordance with a frequency of an output signal from said voltage controlled oscillating means;
means for detecting whether said voltage controlled oscillating means is locked; and
means for turning off a power source for circuits except for at least said voltage controlled oscillating means when it is detected that said voltage controlled oscillating means is in a locked state.

16. An apparatus according to claim 15, in which said second phase lock-in means comprises means for generating a control voltage in accordance with an output from said first phase lock-in means.

17. An apparatus according to claim 15, in which said second phase lock-in means comprises means for supplying, to said second control voltage terminal of said voltage controlled oscillating means, a control voltage in accordance with an output from said phase difference detecting means.

18. A phase-locked loop apparatus comprising:
voltage controlled oscillating means including a first control voltage terminal and a second control voltage terminal having a sensitivity higher than that of said first control voltage terminal;
means for detecting the phase difference between a signal obtained by frequency-dividing an output signal from said voltage controlled oscillating means by a predetermined ratio and a reference signal;
first phase lock-in means for supplying a control voltage in accordance with an output from said phase difference detecting means to said first control voltage terminal of said voltage controlled oscillating means;
second phase lock-in means for supplying a control voltage in accordance with an output from said first phase lock-in means to said second control voltage terminal of said voltage controlled oscillating means, the second phase lock-in means comprising counter means for counting up or counting down a clock pulse to produce the control voltage in accordance with the output from said first phase lock-in means.

19. An apparatus according to claim 18, in which said second phase lock-in means comprises digital/analog converting means for supplying the control voltage in accordance with an output value from said counter means to said second control voltage terminal of said voltage controlled oscillating means.

20. An apparatus according to claim 18, in which said counter means comprises:
a window comparator for detecting whether an output voltage value of said first phase lock-in means falls within a predetermined range; and
a counter for counting up or down the clock pulse in accordance with an output from said window comparator.

21. An apparatus according to claim 18, in which said difference detecting means comprises:
frequency divider means for frequency-dividing the output signal from said voltage controlled oscillating means; and
clock generating means for generating the reference signal, and which further comprises:
means for detecting whether said voltage controlled oscillating means is in a locked state; and
means for turning off a power source for at least said frequency divider means and said clock generating means when the locked state is detected by said lock-state detecting means.

22. An apparatus according to claim 21, in which said locked-state detecting means comprising means for detecting a locked state when an output from said window comparator is not changed for not less than a predetermined period of time.

23. An apparatus according to claim 18, in which said phase difference detecting means comprises:

frequency divider means for frequency-dividing the output signal from said voltage controlled oscillating means; and clock generating means for generating the reference signal, and which further comprises:

means for detecting whether said voltage controlled oscillating means is in a locked state; and means for turning off a power source for at least said frequency divider means and said clock generating means when the locked state is detected by said locked-state detecting means.

24. An apparatus according to claim 23, in which said locked-state detecting means comprises means for detecting a locked state when an output from said first phase lock-in means is not changed for not less than a predetermined period of time and within not less than a predetermined range.

25. A phase-locked loop apparatus comprising:

voltage controlled oscillating means including a control voltage terminal, for producing an output signal having a frequency dependent on a voltage at said terminal;

means for detecting a phase difference between a signal indicative of said output signal from said voltage controlled oscillating means, and a reference signal, and producing a phase difference signal indicative thereof;

counter means, receiving said phase difference signal, for counting up or down depending on said phase difference signal; and phase lock-in means for producing said control voltage in accordance with an output from said counter means and supplying said control voltage to said second control voltage terminal of said voltage controlled oscillating means.

26. An apparatus according to claim 18, in which said voltage controlled oscillating means comprises:

means for outputting a first output signal having a frequency which changes within a first frequency range when a control voltage supplied to said first control voltage terminal changes within a predetermined range; and means for outputting a second output signal having a frequency which changes within a second frequency range wider than the first frequency range when the control voltage supplied to said second control voltage terminal changes within the predetermined range.

27. An apparatus according to claim 21, in which said first phase lock-in means comprises a loop filter including a first resistor connected between an output terminal of said phase difference detecting means and said first control voltage terminal of said voltage controlled oscillating means, a second resistor, and a capacitor, said second resistor and said capacitor being connected in series between said first control voltage terminal and a reference voltage terminal.

* * * * *